(12) United States Patent
Tai et al.

(10) Patent No.: US 11,239,405 B2
(45) Date of Patent: Feb. 1, 2022

(54) METHOD OF PRODUCING A COMPOSITE SUBSTRATE

(71) Applicants: NGK INSULATORS, LTD., Aichi (JP); NGK CERAMIC DEVICE CO., LTD., Aichi (JP)

(72) Inventors: Tomoyoshi Tai, Inazawa (JP); Yuji Hori, Owariasahi (JP); Takahiro Yamadera, Nagoya (JP); Ryosuke Hattori, Ichinomiya (JP); Kengo Suzuki, Nagoya (JP)

(73) Assignees: NGK INSULATORS, LTD., Aichi (JP); NGK CERAMIC DEVICE CO., LTD., Aichi (JP)

(*) Notice: Subject to any disclaimer, the term of this patent is extended or adjusted under 35 U.S.C. 154(b) by 394 days.

(21) Appl. No.: 16/148,448

(22) Filed: Oct. 1, 2018

(65) Prior Publication Data
US 2019/0036000 A1    Jan. 31, 2019

Related U.S. Application Data

(60) Division of application No. 15/001,501, filed on Jan. 20, 2016, now Pat. No. 10,211,389, which is a
(Continued)

(30) Foreign Application Priority Data

Jul. 25, 2013   (JP) ................................. 2013-154505

(51) Int. Cl.
*H01L 41/08*   (2006.01)
*H03H 3/10*    (2006.01)
(Continued)

(52) U.S. Cl.
CPC ........ *H01L 41/081* (2013.01); *H01L 41/0805* (2013.01); *H01L 41/277* (2013.01);
(Continued)

(58) Field of Classification Search
CPC ... H01L 41/0805; H01L 41/081; H01L 41/25; H01L 41/277; H01L 41/311;
(Continued)

(56) References Cited

U.S. PATENT DOCUMENTS 5,998,907 A    12/1999  Taguchi et al.
6,097,133 A *   8/2000  Shimada ............. H01L 41/0805
                                                                310/328
(Continued)

FOREIGN PATENT DOCUMENTS

JP    63-065708 A    3/1988
JP    11-055070 A    2/1999
(Continued)

OTHER PUBLICATIONS

Notification of Reason for Refusal from Korean Patent App. No. 10-2016-7001824 (Aug. 27, 2020).
(Continued)

*Primary Examiner* — A. Dexter Tugbang
(74) *Attorney, Agent, or Firm* — Cermak Nakajima & McGowan LLP; Tomoko Nakajima

(57) ABSTRACT

Described herein is a method of bonding a piezoelectric substrate to a support substrate to form a composite substrate. The piezoelectric substrate has one surface which is positively polarized, and a second surface which is negatively polarized. The method described herein includes the steps of bonding the positively polarized surface of the piezoelectric substrate to one surface of the support substrate by a direct bonding method.

5 Claims, 4 Drawing Sheets

Related U.S. Application Data continuation of application No. PCT/JP2014/065182, filed on Jun. 9, 2014.

(51) Int. Cl.

| | | |
|---|---|---|
| *H03H 9/02* | (2006.01) | |
| *H01L 41/312* | (2013.01) | |
| *H01L 41/332* | (2013.01) | |
| *H01L 41/277* | (2013.01) | |
| *H01L 41/311* | (2013.01) | |
| *H01L 41/25* | (2013.01) | |
| *H03H 3/04* | (2006.01) | |

(52) U.S. Cl.
CPC .......... *H01L 41/312* (2013.01); *H01L 41/332* (2013.01); *H03H 9/02574* (2013.01); *H03H 9/02834* (2013.01); *H01L 41/25* (2013.01); *H01L 41/311* (2013.01); *H03H 3/10* (2013.01); *H03H 2003/045* (2013.01); *H03H 2003/0435* (2013.01); *H03H 2003/0442* (2013.01); *Y10T 29/42* (2015.01)

(58) Field of Classification Search
CPC ....... H01L 41/312; H01L 41/332; H03H 3/10; H03H 9/02574; H03H 9/02834; H03H 2003/0435; H03H 2003/0442; H03H 2003/045; Y10T 29/42
See application file for complete search history.

(56) References Cited

U.S. PATENT DOCUMENTS

| | | | |
|---|---|---|---|
| 2004/0053460 A1* | 3/2004 | Higuchi | H01L 41/332 438/200 |
| 2004/0222717 A1 | 11/2004 | Matsuda et al. | |
| 2009/0152981 A1 | 6/2009 | Owaki et al. | |
| 2010/0156241 A1 | 6/2010 | Suzuki et al. | |
| 2011/0220275 A1* | 9/2011 | Hayakawa | H01L 41/312 156/247 |
| 2011/0226731 A1* | 9/2011 | Funabiki | H01L 41/332 216/20 |
| 2012/0198672 A1* | 8/2012 | Ueda | H03H 3/10 29/25.35 |
| 2014/0191619 A1 | 7/2014 | Ito et al. | |
| 2015/0102707 A1 | 4/2015 | Hori et al. | |
| 2015/0328875 A1 | 11/2015 | Hattori et al. | |
| 2016/0133823 A1 | 5/2016 | Tai et al. | |
| 2018/0053679 A1 | 2/2018 | Hattori et al. | |

FOREIGN PATENT DOCUMENTS

| | | | | |
|---|---|---|---|---|
| JP | 11-163668 A | | 6/1999 | |
| JP | 2001-036160 A | | 2/2001 | |
| JP | 2004-140732 A | | 5/2004 | |
| JP | 2004-186938 A | | 7/2004 | |
| JP | 2006-246050 A | | 9/2006 | |
| JP | 2006-319679 A | | 11/2006 | |
| JP | 2007-288812 A | | 11/2007 | |
| JP | 2008-205888 A | | 9/2008 | |
| JP | 2010232725 A | * | 1/2010 | .......... H03H 9/02015 |
| JP | 2010-220204 A | | 9/2010 | |
| JP | 2011-015178 A | | 1/2011 | |
| KR | 10-0674071 B1 | | 1/2007 | |
| WO | WO2010/067794 A1 | | 6/2010 | |
| WO | WO2012/128268 A1 | | 9/2012 | |

OTHER PUBLICATIONS

International Search Report and Written Opinion for PCT Patent App. No. PCT/JP2014/065182 (Jul. 29, 2014) with English translation of the Search Report.
International Preliminary Report On Patentability for PCT Patent App. No. PCT/JP2014/065182 (Jan. 26, 2016).
Office Action for Japanese Patent App. No. 2015-528189 (Mar. 20, 2018).
Office Action for Japanese Patent App. No. 2015-528189 (Sep. 18, 2018).

* cited by examiner

LENGTH OF SEPARATION though the piezoelectric substrate is bonded to a support substrate with a small thermal expansion coefficient.

METHOD OF PRODUCING A COMPOSITE SUBSTRATE

BACKGROUND OF THE INVENTION

1. Field of the Invention

The present invention relates to a composite substrate and a method of producing the same.

2. Description of the Related Art

Acoustic wave devices include interdigital transducer (IDT) electrodes formed on one surface of a piezoelectric substrate and pick up a signal in a specific frequency band. In recent years, composite substrates obtaining by bonding a thin piezoelectric substrate to a support substrate with a small thermal expansion coefficient have been used to improve thermal characteristics of the acoustic wave devices. As an example of these composite substrates, a composite substrate is known in which lithium tantalate or lithium niobate is used for the piezoelectric substrate and silicon or quartz is used for the support substrate (see PTL 1).

CITATION LIST

Patent Literature

PTL 1: Japanese Unexamined Patent Application Publication No. 2006-319679

SUMMARY OF THE INVENTION

In general, in a composite substrate, IDT electrodes are formed on a positively-polarized surface of a piezoelectric substrate, and a negatively-polarized surface of the piezoelectric substrate is bonded to a support substrate. To produce the composite substrate, the piezoelectric substrate and the support substrate are first bonded by a direct bonding method, and a surface of the piezoelectric substrate is then ground and polished to thin the piezoelectric substrate. When the bonding is performed by the direct bonding method, the bonding surface of the piezoelectric substrate and the bonding surface of the support substrate are irradiated with an argon beam. At this time, when the negatively-polarized surface of the piezoelectric substrate is irradiated with the argon beam, the arithmetic mean roughness Ra after the irradiation when an area 10 μm square is measured with an atomic force microscope (AFM) is about 0.5 nm.

When the bonding is performed by the direct bonding method, bonding strength is increased as the arithmetic mean roughness Ra of the bonding surface is decreased in addition to adhering substances such as an oxide film and a liquid on the surface being completely removed and the surface being activated. It is accordingly desirable that the arithmetic mean roughness Ra of the bonding surface be decreased as much as possible.

The present invention has been made to address the problem, and a primary object of the present invention is to increase the bonding strength in the composite substrate when the piezoelectric substrate and the support substrate are bonded by the direct bonding method.

Solution to Problem

The composite substrate according to the present invention comprises a piezoelectric substrate, one surface of which is a negatively-polarized surface and another surface of which is a positively-polarized surface; and a support substrate bonded to the positively-polarized surface of the piezoelectric substrate by direct bonding.

In the composite substrate, the positively-polarized surface of the piezoelectric substrate is directly bonded to one surface of the support substrate. Now, comparing the positively-polarized surface of the piezoelectric substrate subjected to the direct bonding process with the negatively-polarized surface subjected to the direct bonding process, the surface roughness of the former is better than the surface roughness of the latter when the degree of removal from the surface of the piezoelectric substrates is identical. Accordingly, the bonding strength is higher in the former case than in the latter case when the bonding is performed by the direct bonding method. Examples of the direct bonding process include ion beam irradiation such as an inert gas (argon etc.) and plasma or neutral atomic beam irradiation.

In the composite substrate according to the present invention, the negatively-polarized surface of the piezoelectric substrate may be etched with the strong acid, the etching rate at which the negatively-polarized surface is etched with the strong acid may be higher than the etching rate at which the positively-polarized surface is etched with the strong acid, and the etching rate at which the support substrate is etched with the strong acid may be higher than the etching rate at which the negatively-polarized surface is etched with the strong acid. In the composite substrate, the positively-polarized surface of the piezoelectric substrate is bonded to one surface of the support substrate, and hence the surface of the piezoelectric substrate is the negatively-polarized surface that is etched with the strong acid at a higher rate. Accordingly, the duration required for etching the surface of the piezoelectric substrate with the strong acid by a predetermined thickness, that is, the duration for which the entire composite substrate is immersed into the strong acid during etching is shorter than when the surface of the piezoelectric substrate is the positively-polarized surface. Since the etching rate for the support substrate is higher than for the negatively-polarized surface of the piezoelectric substrate, the support substrate is also etched while the entire composite substrate is immersed into the strong acid. However, since the duration of the immersion into the strong acid is shorter than when the surface of the piezoelectric substrate is the positively-polarized surface as described above, progress in the etching of the support substrate can be inhibited to such a degree that the bonding strength is not affected. Accordingly, in the composite substrate, the bonding strength between the support substrate and the piezoelectric substrate can be sufficiently ensured even after the piezoelectric substrate surface is etched with the strong acid.

In the composite substrate according to the present invention, the strong acid is preferably hydrofluoric nitric acid or hydrofluoric acid. Use of hydrofluoric nitric acid or hydrofluoric acid enables the surface of the piezoelectric substrate (negatively-polarized surface) to be etched at a relatively high rate.

In the composite substrate according to the present invention, the support substrate preferably has a thermal expansion coefficient smaller than the thermal expansion coefficient of the piezoelectric substrate. In this manner, when the composite substrate is used to fabricate an acoustic wave device, the dimensional variation of the piezoelectric substrate due to a variation in temperature can be reduced and frequency characteristics can be suppressed from varying due to a variation in temperature of the acoustic wave device.

In the composite substrate according to the present invention, the piezoelectric substrate is preferably a lithium tantalate (LT) substrate or a lithium niobate (LN) substrate, and the support substrate is preferably a silicon substrate or a glass substrate. Because the LT substrate and the LN substrate have a large polarization vector, the etching rate at which the positively-polarized surface is etched with the strong acid is likely to differ to a large extent from the etching rate at which the negatively-polarized surface is etched with the strong acid, and application of the present invention is significant. In addition, application of the present invention is significant because the silicon substrate and the glass substrate are etched with the strong acid at a rate higher than in the case of the LT substrate and the LN substrate, and the degree of progress in the etching needs to be suppressed by decreasing the duration for which each substrate is immersed into the strong acid.

A method of producing a composite substrate according to the present invention includes a bonding step of bonding a positively-polarized surface of a piezoelectric substrate, one surface of which is a negatively-polarized surface and another surface of which is a positively-polarized surface, to one surface of a support substrate by a direct bonding method to produce the composite substrate.

In the method of producing a composite substrate, the positively-polarized surface of the piezoelectric substrate is directly bonded to one surface of the support substrate. Now, comparing the positively-polarized surface of the piezoelectric substrate subjected to the direct bonding process with the negatively-polarized surface subjected to the direct bonding process, the surface roughness of the former is better than the surface roughness of the latter. Accordingly, the bonding strength is higher in the former case than in the latter case when the bonding is performed by the direct bonding method.

The method of producing a composite substrate according to the present invention further include a substrate thinning step of grinding and polishing the negatively-polarized surface of the piezoelectric substrate of the composite substrate obtained in the bonding step, and an etching step of etching, with a strong acid, an affected layer generated in the negatively-polarized surface in the substrate thinning step. In the piezoelectric substrate and support substrate, an etching rate at which the negatively-polarized surface is etched with the strong acid may be higher than an etching rate at which the positively-polarized surface is etched with the strong acid and an etching rate at which the support substrate is etched with the strong acid may be higher than the etching rate at which the negatively-polarized surface is etched with the strong acid. In the substrate thinning step, the affected layer (layer in which the quality of the material has been changed due to grinding and polishing) is generated in the negatively-polarized surface. In the etching step, the affected layer is etched and removed with the strong acid. At this time, the duration required for etching the affected layer generated in the surface of the piezoelectric substrate with the strong acid, that is, the duration for which the entire composite substrate is immersed into the strong acid during etching is shorter than when the surface of the piezoelectric substrate is the positively-polarized surface. Since the etching rate for the support substrate is higher for the negatively-polarized surface of the piezoelectric substrate, the support substrate is also etched while the entire composite substrate is immersed into the strong acid. However, since the duration of the immersion into the strong acid is shorter than when the surface of the piezoelectric substrate is the positively-polarized surface as described above, progress in the etching of the support substrate can be inhibited to such a degree that the bonding strength is not affected. Accordingly, in the composite substrate, the bonding strength between the support substrate and the piezoelectric substrate can be sufficiently ensured even after the piezoelectric substrate surface is etched with the strong acid.

In the method of producing a composite substrate according to the present invention, hydrofluoric nitric acid or hydrofluoric acid is preferably used as the strong acid. Use of hydrofluoric nitric acid or hydrofluoric acid enables the surface of the piezoelectric substrate to be etched at a relatively high rate.

In the method of producing a composite substrate according to the present invention, a substrate having a thermal expansion coefficient smaller than a thermal expansion coefficient of the piezoelectric substrate is preferably prepared as the support substrate. In this manner, when the composite substrate is used to fabricate an acoustic wave device, the dimensional variation of the piezoelectric substrate due to a variation in temperature can be reduced and frequency characteristics can be suppressed from varying due to a variation in temperature of the acoustic wave device.

In the method of producing a composite substrate according to the present invention, an LT substrate or an LN substrate is preferably prepared as the piezoelectric substrate, and a silicon substrate or a glass substrate is preferably prepared as the support substrate. Because the LT substrate and the LN substrate have a large polarization vector, the etching rate at which the positively-polarized surface is etched with the strong acid is likely to differ to a large extent from the etching rate at which the negatively-polarized surface is etched with the strong acid, and application of the present invention is significant. In addition, because the silicon substrate and the glass substrate are etched with the strong acid at a higher rate compared with the LT substrate and the LN substrate and highly need to be immersed into the strong acid for a shorter duration so that the degree of progress in the etching is suppressed, application of the present invention is significant.

DESCRIPTION OF PREFERRED EMBODIMENTS

Figure 1:
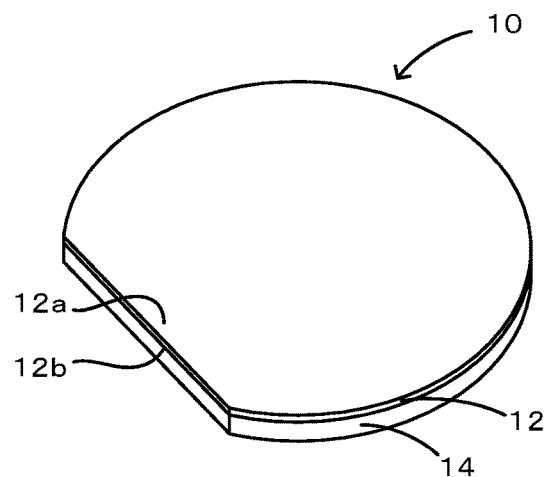
FIG. 1 is a perspective view of a composite substrate 10.

An embodiment of the present invention will now be described with reference to the drawings. FIG. 1 is a perspective view of a composite substrate 10 according to the embodiment.

In the composite substrate 10, a piezoelectric substrate 12 and a support substrate 14 are bonded by direct bonding. An exemplary direct bonding method is to first clean the bonding surfaces of the substrates 12 and 14, irradiate the bonding surfaces with an ion beam of an inert gas such as argon to activate the bonding surfaces, and then bond the substrates 12 and 14.

The piezoelectric substrate 12 is a substrate that can propagate a surface acoustic wave (SAW). Examples of the material of the piezoelectric substrate 12 include lithium tantalate (LT), lithium niobate (LN), lithium niobate-lithium tantalate solid-solution single crystal, quartz, lithium borate, zinc oxide, aluminum nitride, langasite (LGS), and langatate (LGT). Among these, LT or LN is preferable. The reason is that LT and LN are suitable for acoustic wave devices for high frequencies and broadband frequencies because LT and LN allow the SAW to propagate at a high rate therethrough and have a high electromechanical coupling coefficient. The thickness of the piezoelectric substrate 12 is not particularly limited and may be, for example, 0.2 to 50 μm. One surface of the piezoelectric substrate 12 is a negatively-polarized surface 12a and the other surface of the piezoelectric substrate 12 is a positively-polarized surface 12b. The etching rate at which the negatively-polarized surface 12a is etched with a strong acid (for example, hydrofluoric nitric acid or hydrofluoric acid) is higher than the etching rate at which the positively-polarized surface 12b is etched with the strong acid. The positively-polarized surface 12b of the piezoelectric substrate 12 is directly bonded to the support substrate 14, and the negatively-polarized surface 12a is exposed. The negatively-polarized surface 12a of the piezoelectric substrate 12 is etched with the strong acid.

Figure 2A:
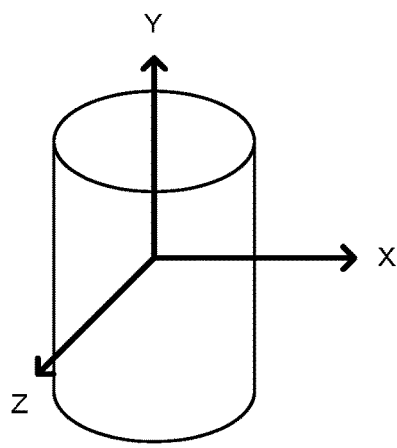
FIGS. 2A-2B are an explanatory drawing of a cut angle of a wafer cut off from a piezoelectric single crystal.
Figure 2B:
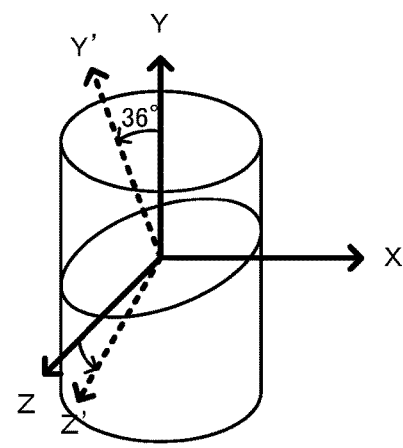

Table 1 shows the rate at which various types of LT and LN are etched with hydrofluoric nitric acid at 65° C. Throughout the substrates, the etching rate for the negatively-polarized surface is higher than for the positively-polarized surface. The cut angle shown in Table 1 will be described with reference to FIGS. 2A-2B. FIG. 2A shows a state before a piezoelectric single crystal is cut into wafers, in which the X-axis represents the left-and-right direction, the Y-axis represents the vertical direction, and the Z-axis represents a direction perpendicular to the plane of the figure. In the piezoelectric single crystal, the direction of spontaneous polarization is a c-axis direction, i.e., the Z-axis direction. For example, "LT36° Y" in Table 1 represents 36° rotated Y-cut LT and means, when the Y-axis and the Z-axis are rotated 36° in the same direction about the X-axis to obtain a new Y'-axis and a new Z'-axis as shown in FIG. 2B, a wafer that is cut such that the Y'-axis coincides with the normal to its upper surface. The direction in which the acoustic wave propagates is the X-axis direction.

TABLE 1

| Type of substrate | Rate of etching with hydrofluoric nitric acid at 65° C. (unit μm/hr) | |
|---|---|---|
| | Positively-polarized surface | Negatively-polaried surface |
| LN 36°Y | 0.08 | 1.3 |
| LN 45°Y | 0.2 | 7.0 |
| LN Z | 0.5 | 16.3 |
| LT36°Y | 0.07 | 0.36 |
| LT40°Y | 0.12 | 1.15 |
| LT42° Y | 0.14 | 1.64 |

The support substrate 14 has a thermal expansion coefficient smaller than the thermal expansion coefficient of the piezoelectric substrate 12 and is bonded to the back surface of the piezoelectric substrate 12 by direct bonding. The support substrate 14 having a thermal expansion coefficient smaller than the thermal expansion coefficient of the piezoelectric substrate 12 can reduce the dimensional variation of the piezoelectric substrate 12 due to a variation in temperature and inhibit frequency characteristics from varying due to temperature when the composite substrate 10 is used as an acoustic wave device. The support substrate 14 is made of a material that is etched with the strong acid at a higher rate (for example, 10 to 50 μm/hr) than the etching rate at which the negatively-polarized surface 12a of the piezoelectric substrate 12 is etched with the strong acid. Examples of such a material of the support substrate 14 include silicon and glass (such as borosilicate glass and quartz glass). The thickness of the support substrate 14 is not particularly limited and may be, for example, 200 to 1200 μm.

A method of producing the composite substrate 10 will now be described below with reference to FIGS. 3A-3D and FIGS. 4A-4D. FIGS. 3A-3D and FIGS. 4A-4D are a sectional view and a perspective view that schematically show production processes for the composite substrate 10.

Figure 3A:
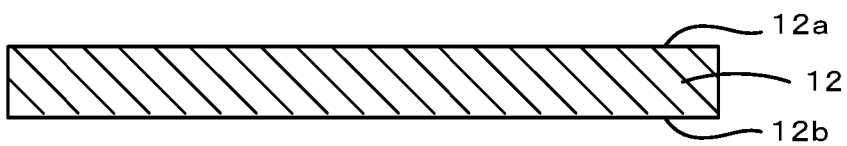
FIGS. 3A-3D are a sectional view that schematically show production processes for the composite substrate 10.
Figure 3B:
Figure 3C:
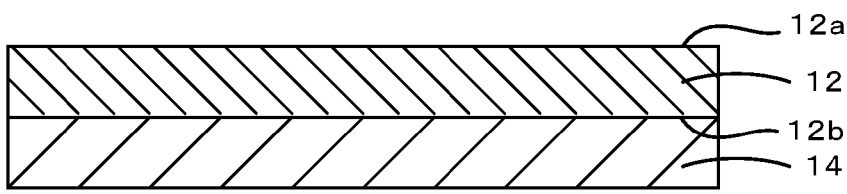
Figure 3D:
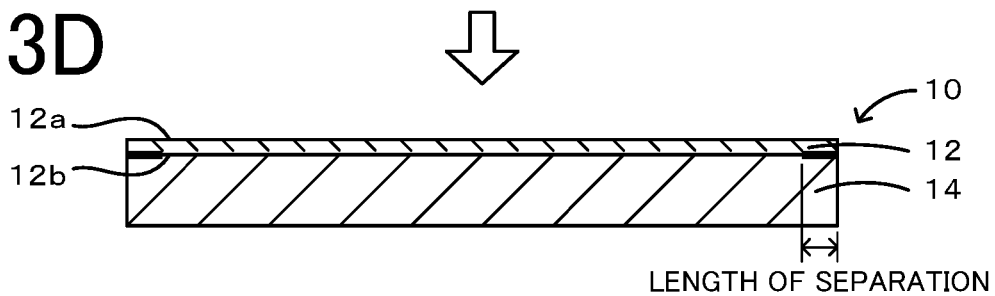
Figure 4A:
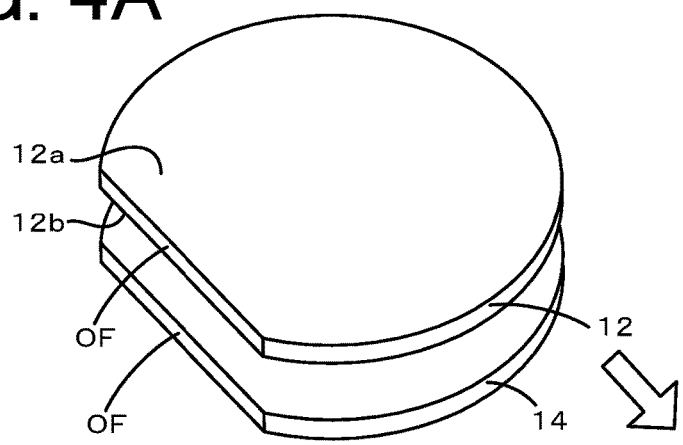
FIGS. 4A-4D are a perspective view that schematically show production processes for the composite substrate 10.
Figure 4B:
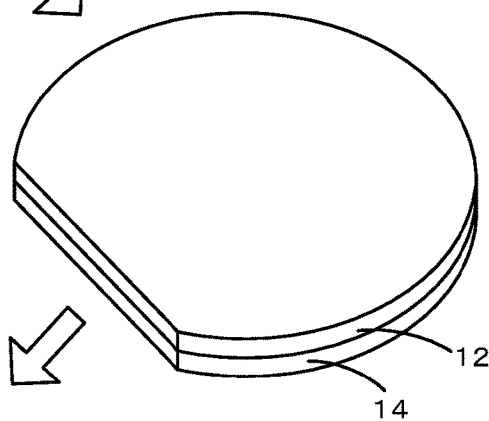
Figure 4C:
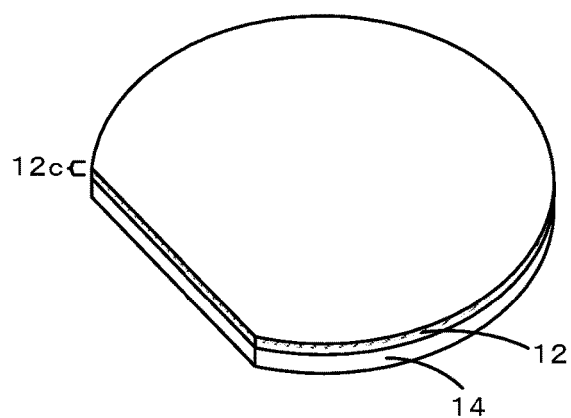
Figure 4D:
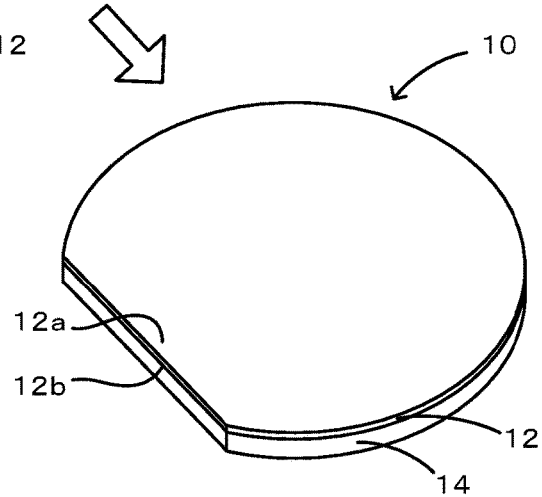

The piezoelectric substrate 12, which is disc-shaped and has an orientation flat (OF), and the support substrate 14 having the same shape as the piezoelectric substrate 12 are first prepared (see FIG. 3A and FIG. 4A). The bonding surfaces of the substrates 12 and 14 are next cleaned to remove contaminants adhering to the bonding surfaces. Here, the bonding surface of the piezoelectric substrate 12 is the positively-polarized surface 12b. The bonding surfaces of the substrates 12 and 14 are then irradiated with an ion beam of an inert gas such as argon to remove residual impurities (such as an oxide film and adhering substances) and to activate the bonding surfaces. The substrates 12 and 14 are then positioned such that the OFs of the substrates 12 and 14 coincide with each other at room temperature under a vacuum, and then the substrates 12 and 14 are bonded (see FIG. 3B and FIG. 4B). The negatively-polarized surface 12a thus becomes the surface of the piezoelectric substrate 12. The surface of the piezoelectric substrate 12 is next ground and polished to a predetermined thickness to thin the piezoelectric substrate 12 (see FIG. 3C and FIG. 4C). An affected layer 12c is obtained in the surface of the piezoelectric substrate 12 after grinding and polishing. The affected layer 12c is a layer in which the quality of the material has been changed due to grinding and polishing. The entire bonded substrates are then immersed into the strong acid to remove the affected layer 12c of the piezoelectric substrate 12 by etching and further thin the piezoelectric substrate 12, so that the composite substrate 10 is obtained (see FIG. 3D and FIG. 4D).

Figure 5:
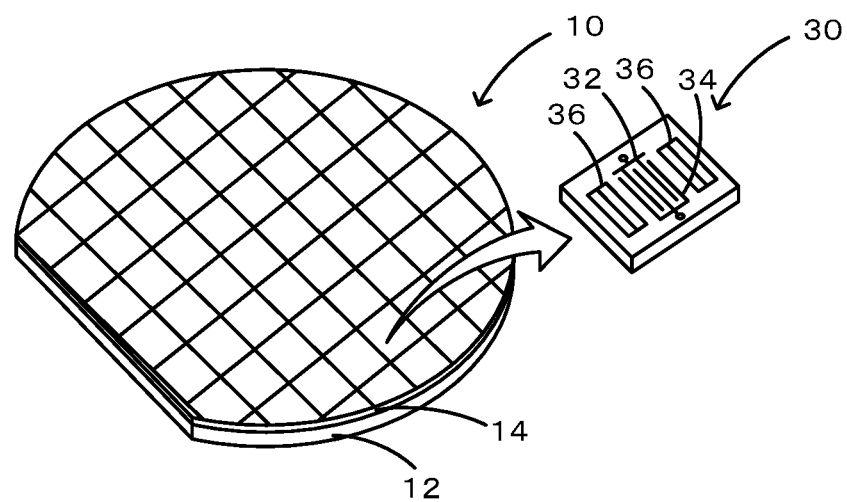
FIG. 5. is a perspective view of one-port SAW resonators 30 fabricated using the composite substrate 10.

The composite substrate 10 thus obtained is then formed into an aggregate of a number of surface acoustic wave devices by using a typical photolithography technique and cut into individual surface acoustic wave devices by dicing. FIG. 5 shows the state where the composite substrate 10 is formed into an aggregate of one-port SAW resonators 30, which are surface acoustic wave devices. In each one-port SAW resonator 30, interdigital transducer (IDT) electrodes 32 and 34 and reflecting electrodes 36 are formed on the surface of the piezoelectric substrate 12 by using a photolithography technique.

In the composite substrate 10 according to the embodiment of the present invention described above, the positively-polarized surface 12b of the piezoelectric substrate 12 is directly bonded to one surface of the support substrate 14. Now, comparing the case of irradiating the positively-polarized surface 12b of the piezoelectric substrate 12 with the ion beam with the case of irradiating the negatively-polarized surface 12a with the ion beam, the surface roughness of the surface irradiated with the ion beam is better in the former case than in the latter case. Accordingly, the bonding strength is higher in the former case than in the latter case when the bonding is performed by the direct bonding method.

In addition, the surface of the piezoelectric substrate 12 is the negatively-polarized surface 12a that is etched with the strong acid at a higher rate. Accordingly, the duration required for etching the surface of the piezoelectric substrate 12 with the strong acid by a predetermined thickness, that is, the duration for which the entire composite substrate 10 is immersed into the strong acid during etching is shorter than when the surface of the piezoelectric substrate 12 is the positively-polarized surface 12b. Since the etching rate for the support substrate 14 is higher than for the negatively-polarized surface 12a of the piezoelectric substrate 12, the support substrate 14 is also etched while the entire composite substrate 10 is immersed into the strong acid. However, since the duration of the immersion into the strong acid is shorter than when the surface of the piezoelectric substrate 12 is the positively-polarized surface 12b as described above, progress in the etching of the support substrate 14 can be inhibited to such a degree that the bonding strength is not affected. Accordingly, in the composite substrate 10, the bonding strength between the support substrate 14 and the piezoelectric substrate 12 can be sufficiently ensured even after the surface of the piezoelectric substrate 12 is etched with the strong acid.

It is to be noted that the present invention is not limited to the embodiment described above, and needless to say, the present invention can be carried out in various aspects within the technical scope of the present invention.

Although the piezoelectric substrate 12 is exemplified by the various types of LT and LN shown in Table 1 in the above embodiment, any piezoelectric substrate enables the same effect as in the above embodiment to be achieved, provided that the etching rate at which the negatively-polarized surface of the piezoelectric substrate is etched with the strong acid is higher than the etching rate at which the positively-polarized surface of the piezoelectric substrate is etched with the strong acid. In addition, although the support substrate 14 is exemplified by silicon and glass, any substrate enables the same effect as in the above embodiment to be achieved, provided that the etching rate at which the substrate is etched with the strong acid is higher than the etching rate at which the negatively-polarized surface of the piezoelectric substrate 12 is etched with the strong acid.

Although the piezoelectric substrate 12 and the support substrate 14 are bonded by direct bonding using an ion beam in the above embodiment, a method using a plasma or neutral atomic beam may be used instead of the method using an ion beam.

Japanese Unexamined Patent Application Publication No. 2004-186938 discloses that IDT electrodes are formed on the negatively-polarized surface of a piezoelectric substrate in an acoustic wave device, including a rear electrode on the surface of the piezoelectric substrate opposite the surface on which the IDT electrodes are formed, in order to prevent corrosion of the electrodes due to the effect of a local cell between the rear electrode and the IDT electrodes. This publication, however, does not describe using a composite substrate for the acoustic wave device, bonding a piezoelectric substrate and a support substrate by a direct bonding method with an ion beam, or removing the affected layer on the piezoelectric substrate surface by etching using a strong acid. For this reason, neither a problem of increasing the bonding strength of the composite substrate nor a problem of the bonding boundaries of the composite substrate being separated due to etching using a strong acid are included therein, and of course, a technique to solve these problems is not included therein. Therefore, the present invention cannot be readily conceived by a person skilled in the art based on this publication.

EXAMPLES

Example 1

As the piezoelectric substrate, an LT 42° Y-cut substrate (a thickness of 250 μm) was prepared in which the direction of propagation of the acoustic wave was the X-axis direction and the Y-axis and the Z-axis were rotated 42° about the X-axis. An Si (111) substrate (a thickness of 230 μm) was prepared as the support substrate. Both of the substrates were placed in a vacuum chamber at $2 \times 10^{-6}$ (Pa), and the positively-polarized surface of the piezoelectric substrate and one surface of the support substrate were irradiated with an argon beam for 60 seconds. After the irradiation, the irradiated surfaces of the substrates were brought into contact with each other, and the substrates were pressed with 2000 kg and bonded by direct bonding. AFM measurement revealed that the arithmetic mean roughness Ra of the positively-polarized surface of the piezoelectric substrate irradiated with the argon beam under the same conditions as above was 0.3 nm (measured area was 10 μm square). The degree of removal from the positively-polarized surface at this time was 1 nm. The bonded body was removed from the vacuum chamber, and the piezoelectric substrate was ground to 30 μm. The piezoelectric substrate was then polished to 25 μm with a tin surface plate while a diamond slurry (particle diameter of 1 μm) was dripped. The piezoelectric substrate was further polished to 20 μm with a urethane pad while colloidal silica (particle diameter of 20 nm) was dripped. As a result of the bonding strength of the bonded body after polishing being evaluated by a crack opening method, a surface energy of 1.8 J/cm² was obtained. The bonded body after polishing was then immersed into hydrofluoric nitric acid at 65° C. for one minute to remove the affected layer on the piezoelectric substrate surface by etching, so that the composite substrate was obtained. At this time, the degree of etching was 20 nm, the surface roughness Ra after etching was 0.3 nm, and the length of the separation of the bonding boundaries after etching was 0.1 mm (length of the separation extending from the outer circumference of the bonding boundaries toward the substrate center, see FIG. 3D).

Comparative Example 1

In example 1, the negatively-polarized surface of the piezoelectric substrate and one surface of the support substrate were directly bonded. AFM measurement revealed that the arithmetic mean roughness Ra of the negatively-polarized surface of the piezoelectric substrate irradiated with the argon beam was 0.5 nm (measured area was 10 μm square). The degree of removal from the negatively-polarized surface at this time was 1 nm. As a result of the bonding strength of the bonded body after polishing being evaluated by the crack opening method, a surface energy of 1.5 J/cm² was obtained. A composite substrate was obtained in the same manner as in example 1 except that the bonded body was immersed into hydrofluoric nitric acid for 10 minutes to etch the affected layer after the positively-polarized surface of the piezoelectric substrate was ground and polished. At this time, the degree of etching was 23 nm, the surface roughness Ra after etching was 0.5 nm, and the length of the separation of the bonding boundaries after etching was 0.5 mm.

In example 1, the bonding strength between the piezoelectric substrate and the support substrate was increased compared with comparative example 1. In addition, in example 1, the etching time for removing substantially the same amount of the affected layer was reduced to one-tenth that of comparative example 1. Accordingly, in example 1, the amount in which the support substrate was etched upon etching was reduced and the separation of the bonding boundaries was suppressed to one-fifth that of comparative example 1.

The present application claims priority from Japanese Patent Application No. 2013-154505, filed on Jul. 25, 2013, the entire contents of which are incorporated herein by reference.

Needless to say, the above examples do not limit the present invention in any way.

What is claimed is:

1. A method of producing a composite substrate, comprising a bonding step of bonding a positively-polarized surface of a first substrate, which is a piezoelectric substrate, one surface of which is a negatively-polarized surface and another surface of which is the positively-polarized surface, to one surface of a second substrate, which is a support substrate, by a direct bonding method to produce the composite substrate, wherein the second substrate is not a piezoelectric substrate; and a substrate thinning step of grinding and polishing the negatively-polarized surface of the piezoelectric substrate of the composite substrate obtained in the bonding step.

2. The method of producing a composite substrate according to claim 1, further comprising:

an etching step of etching, with a strong acid, an affected layer generated in the negatively-polarized surface in the substrate thinning step, wherein, in the piezoelectric substrate and support substrate, an etching rate at which the negatively-polarized surface is etched with the strong acid is higher than an etching rate at which the positively-polarized surface is etched with the strong acid and an etching rate at which the support substrate is etched with the strong acid is higher than the etching rate at which the negatively-polarized surface is etched with the strong acid.

3. The method of producing a composite substrate according to claim 2, wherein hydrofluoric nitric acid or hydrofluoric acid is used as the strong acid.

4. The method of producing a composite substrate according to claim 1, wherein a substrate having a thermal expansion coefficient smaller than a thermal expansion coefficient of the piezoelectric substrate is used as the support substrate.

5. The method of producing a composite substrate according to claim 1, wherein a lithium tantalate substrate or a lithium niobate substrate is prepared as the piezoelectric substrate, and a silicon substrate or a glass substrate is used as the support substrate.

* * * * *